США009460892B2

United States Patent
Nakada et al.

(10) Patent No.: US 9,460,892 B2
(45) Date of Patent: Oct. 4, 2016

(54) CHARGED PARTICLE BEAM WRITING METHOD, COMPUTER-READABLE RECORDING MEDIUM, AND CHARGED PARTICLE BEAM WRITING APPARATUS

(71) Applicant: NuFlare Technology, Inc., Yokohama (JP)

(72) Inventors: Sumito Nakada, Kanagawa (JP); Hikaru Yamamura, Kanagawa (JP); Osamu Iizuka, Kanagawa (JP); Hideyuki Tsurumaki, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 238 days.

(21) Appl. No.: 14/090,041

(22) Filed: Nov. 26, 2013

(65) Prior Publication Data

US 2014/0166869 A1    Jun. 19, 2014

(30) Foreign Application Priority Data

Dec. 13, 2012    (JP) .................................. 2012-271995

(51) Int. Cl.
| | | |
|---|---|---|
| *H01J 37/30* | (2006.01) | |
| *H01J 37/304* | (2006.01) | |
| *H01J 37/317* | (2006.01) | |
| *B82Y 10/00* | (2011.01) | |
| *B82Y 40/00* | (2011.01) | |

(52) U.S. Cl.
CPC ............ *H01J 37/3045* (2013.01); *B82Y 10/00* (2013.01); *B82Y 40/00* (2013.01); *H01J 37/3174* (2013.01); *H01J 37/3002* (2013.01); *H01J 37/3177* (2013.01)

(58) Field of Classification Search
CPC ............ H01J 37/3002; H01J 37/3177; H01J 37/3045
See application file for complete search history.

(56) References Cited

U.S. PATENT DOCUMENTS

| | | | | |
|---|---|---|---|---|
| 6,352,799 | B1 * | 3/2002 | Nakasuji ................ | B82Y 10/00 250/492.22 |
| 8,507,873 | B2 * | 8/2013 | Shinkawa .............. | B82Y 10/00 350/396 R |

(Continued)

FOREIGN PATENT DOCUMENTS

| | | |
|---|---|---|
| JP | 7-142321 A | 6/1995 |
| JP | 9-260247 A | 10/1997 |

(Continued)

OTHER PUBLICATIONS

Combined Office Action and Search Report issued Dec. 11, 2014 in Taiwanese Patent Application No. 102145870.

(Continued)

*Primary Examiner* — Christine Sung
(74) *Attorney, Agent, or Firm* — Oblon, McClelland, Maier & Neustadt, L.L.P.

(57) ABSTRACT

A charged particle beam writing method according to embodiments of the present disclosure includes: storing in a charged particle beam writing apparatus a position coordinate at which a drift amount is diagnosed; storing in the charged particle beam writing apparatus first and second time interval patterns which define time intervals to diagnose the drift amount of the charged particle beam; performing first writing of irradiating a target object with the charged particle beam, and writing a writing pattern on the target object while diagnosing the drift amount based on the first time interval pattern during the writing; and performing second writing of writing a predetermined writing pattern while diagnosing the drift amount when the writing reaches the position coordinate and diagnosing the drift amount based on the second time interval pattern during the writing after the writing reaches the position coordinate.

15 Claims, 8 Drawing Sheets

(56) References Cited

U.S. PATENT DOCUMENTS

| | | | |
|---|---|---|---|
| 8,835,881 B2* | 9/2014 | Kamikubo | H01J 37/3002 250/396 R |
| 2007/0023689 A1* | 2/2007 | Iizuka | B82Y 10/00 250/492.22 |
| 2009/0230316 A1* | 9/2009 | Goto | B82Y 10/00 250/396 R |
| 2010/0209833 A1 | 8/2010 | Kurohori | |
| 2013/0037724 A1* | 2/2013 | Tsuruta | H01J 37/3045 250/397 |
| 2013/0177855 A1 | 7/2013 | Nakada et al. | |

FOREIGN PATENT DOCUMENTS

| | | |
|---|---|---|
| JP | 2010-192666 | 9/2010 |
| JP | 2013-143441 | 7/2013 |
| TW | 201102763 A | 1/2011 |

OTHER PUBLICATIONS

Office Action issued Jul. 19, 2016, in Japanese Patent Application No. 2012-271995 (with English-language translation).

* cited by examiner

CHARGED PARTICLE BEAM WRITING METHOD, COMPUTER-READABLE RECORDING MEDIUM, AND CHARGED PARTICLE BEAM WRITING APPARATUS

CROSS-REFERENCE TO RELATED APPLICATION

This application is based upon and claims the benefit of priority from Japanese Patent Applications No. 2012-271995, filed on Dec. 13, 2012, the entire contents of which are incorporated herein by reference.

FIELD OF THE INVENTION

Embodiments described herein relate generally to a charged particle beam writing method, a computer-readable recording medium and a charged particle beam writing apparatus.

BACKGROUND OF THE INVENTION

In order to form a desired circuit pattern on semiconductor devices, a lithography technique is used. According to the lithography technique, a pattern is transferred using an original pattern which is referred to as a "mask (reticle)". Further, to manufacture a precise reticle, an electron beam pattern writing technique which has excellent resolution is used.

One method of an electron beam writing apparatus which performs electron beam pattern writing on a mask includes a variable-shaped beam method. According to the variable-shaped beam method, by forming desirable shape by causing a beam to pass through both an opening of a first shaping aperture plate and an opening of a second shaping aperture plate, a figure is written on a target object set on a movable stage by an electron beam controlled to be deflected by a deflector. One time of irradiation of an electron beam is referred to as "shot".

During writing on a mask or stand-by for writing, a drift (or a beam drift) which causes a shift from an irradiation position of an electron beam from a desired position occurs in some cases. When, for example, a mask is irradiated by an electron beam, a reflected electron is produced. The produced reflected electron causes charge up by colliding against an optical system or a detector in an electron beam writing apparatus, and a undesired electric field is produced. Then, a trajectory of the electron beam deflected and irradiated toward a mask changes. Such charge up causes a drift of an electron beam.

When a drift amount of an electron beam exceeds an allowable range, precision to write a pattern deteriorates. Hence, drift diagnosis for monitoring the drift amount of the electron beam during writing is performed. Further, as a result of drift diagnosis, drift correction for correcting the drift according to the obtained drift amount is performed.

JP-A 2010-192666 discloses an electron beam pattern writing method of changing a time interval to execute drift correction, based on a change amount of an area density of an area to be written.

SUMMARY OF THE INVENTION

A charged particle beam writing method according to one aspect of the present disclosure includes: storing in a charged particle beam writing apparatus a position coordinate; storing in the charged particle beam writing apparatus a first time interval pattern defining first time intervals to diagnose a drift amount of a charged particle beam and a second time interval pattern associated with the position coordinate and defining second time intervals to diagnose a drift amount of the charged particle beam; performing a first writing by irradiating a target object with the charged particle beam using the charged particle beam writing apparatus, and writing a first predetermined writing pattern on the target object diagnosing a drift amount of the charged particle beam based on the first time interval pattern during the first writing; diagnosing a drift amount of the charged particle beam when the first writing reaches the position coordinate; and performing a second writing by irradiating the target object with the charged particle beam after the first writing reaches the position coordinate, and writing a second predetermined writing pattern on the target object diagnosing a drift amount of the charged particle beam based on the second time interval pattern during the second writing.

A computer-readable recording medium according to one aspect of the present disclosure has a charged particle beam writing program recorded thereon, and the charged particle beam writing program causes a computer mounted on a writing apparatus to execute: processing of storing in a charged particle beam writing apparatus a position coordinate; processing of storing in the charged particle beam writing apparatus a first time interval pattern defining first time intervals to diagnose a drift amount of a charged particle beam and a second time interval pattern associated with the position coordinate and defining second time intervals to diagnose a drift amount of the charged particle beam; processing of performing a first writing by irradiating a target object with the charged particle beam using the charged particle beam writing apparatus, and writing a first predetermined writing pattern on the target object diagnosing a drift amount of the charged particle beam based on the first time interval pattern during the first writing; processing of diagnosing a drift amount of the charged particle beam when the first writing reaches the position coordinate; and processing of performing a second writing by irradiating the target object with the charged particle beam after the first writing reaches the position coordinate, and writing a second predetermined writing pattern on the target object diagnosing a drift amount of the charged particle beam based on the second time interval pattern during the second writing.

A charged particle beam writing apparatus according to one aspect of the present disclosure has: a first memory configured to store a position coordinate at which a drift amount is diagnosed; a second memory configured to store a first time interval pattern defining first time intervals to diagnose a drift amount of a charged particle beam and a second time interval pattern associated with the position coordinate and defining second time intervals to diagnose a drift amount of the charged particle beam; a writing unit configured to irradiate a target object with the charged particle beam and write a predetermined writing pattern on the target object; a pattern writing position monitoring unit configured to monitor a pattern writing position; and a drift diagnosis control unit configured to comprise a function of diagnosing a drift amount of the charged particle beam based on the first or second time interval pattern, and changing diagnosis of a drift amount based on the first time interval pattern to diagnosis of a drift amount based on the second time interval pattern, based on information of the pattern writing position obtained by the pattern writing position monitoring unit.

DETAILED DESCRIPTION OF THE EMBODIMENTS

Hereinafter, embodiments of the present disclosure will be described with reference to the drawings. In the following embodiments, a configuration using an electron beam will be described as an example of the charged particle beam. However, the charged particle beam is not limited to an electron beam, and may be a beam such as an ion beam using other charged particles.

Further, in the embodiments, a mask substrate (or a mask or a mask blanks) used to manufacture, for example, a semiconductor which is an example of a "target object" on which a writing pattern is written will be described as an example.

In this description, "pattern writing data" is original data of a pattern to be written on the target object. The pattern writing data is data obtained by converting a format of design data generated by a designer using, for example, a CAD such that operation processing can be performed in a writing apparatus. A writing pattern such as a figure is defined by, for example, coordinates such as apexes of a figure.

Further, "shot" in this description means one time of irradiation of a charged particle beam.

Furthermore, in this description, a "shot density" means the number of shots per unit area in a pattern writing area or the number of shots per unit time during writing.

Still further, in this description, "during writing" is a concept that not only represents that a target object is actually irradiated by a charged particle beam but also represents that writing processing including a time before and after irradiation of a charged particle beam is being performed.

Moreover, in this description, an "event" means an event which may triggers a change of a time interval pattern to diagnose the drift amount.

Further, in this description, "diagnosis of a drift amount" or "drift diagnosis" means measurement of a shift amount (drift amount) from a desired position of an irradiation position of a charged particle beam produced during writing.

Furthermore, in this description, "drift correction" means correcting a drift of a charged particle beam performed based on a diagnosis result of the drift amount. So-called zero correction for not correcting a drift since the drift amount is zero or little is also included in "drift correction".

First Embodiment

An electron beam writing apparatus according to the present embodiment has: a first memory configured to store a position coordinate at which a drift amount is diagnosed; a second memory configured to store a first time interval pattern which defines a time interval to diagnose a drift amount of a charged particle beam and a second time interval pattern which is associated with the position coordinate and defines the time interval to diagnose the drift amount of the charged particle beam; a writing unit configured to irradiate a target object with the charged particle beam and write a predetermined writing pattern on the target object; a pattern writing position monitoring unit configured to monitor a pattern writing position; and a drift diagnosis control unit configured to have a function of diagnosing the drift amount of the charged particle beam based on the first or second time interval pattern, and changing diagnosis of the drift amount based on the first time interval pattern to diagnosis of the drift amount based on the second time interval pattern, based on information of the pattern writing position obtained by the pattern writing position monitoring unit.

The electron beam writing apparatus according to the embodiment employs the above configuration to perform drift diagnosis when writing reaches the position coordinate and change a time interval pattern for performing drift diagnosis. By this means, drift diagnosis is adequately executed, so that it is possible to make high writing precision and high throughput compatible. A case will be described with the present embodiment as an example where the position coordinate is a position coordinate of a position at which a drift amount is predicted to significantly change at a specific position as a boundary.

Figure 1:
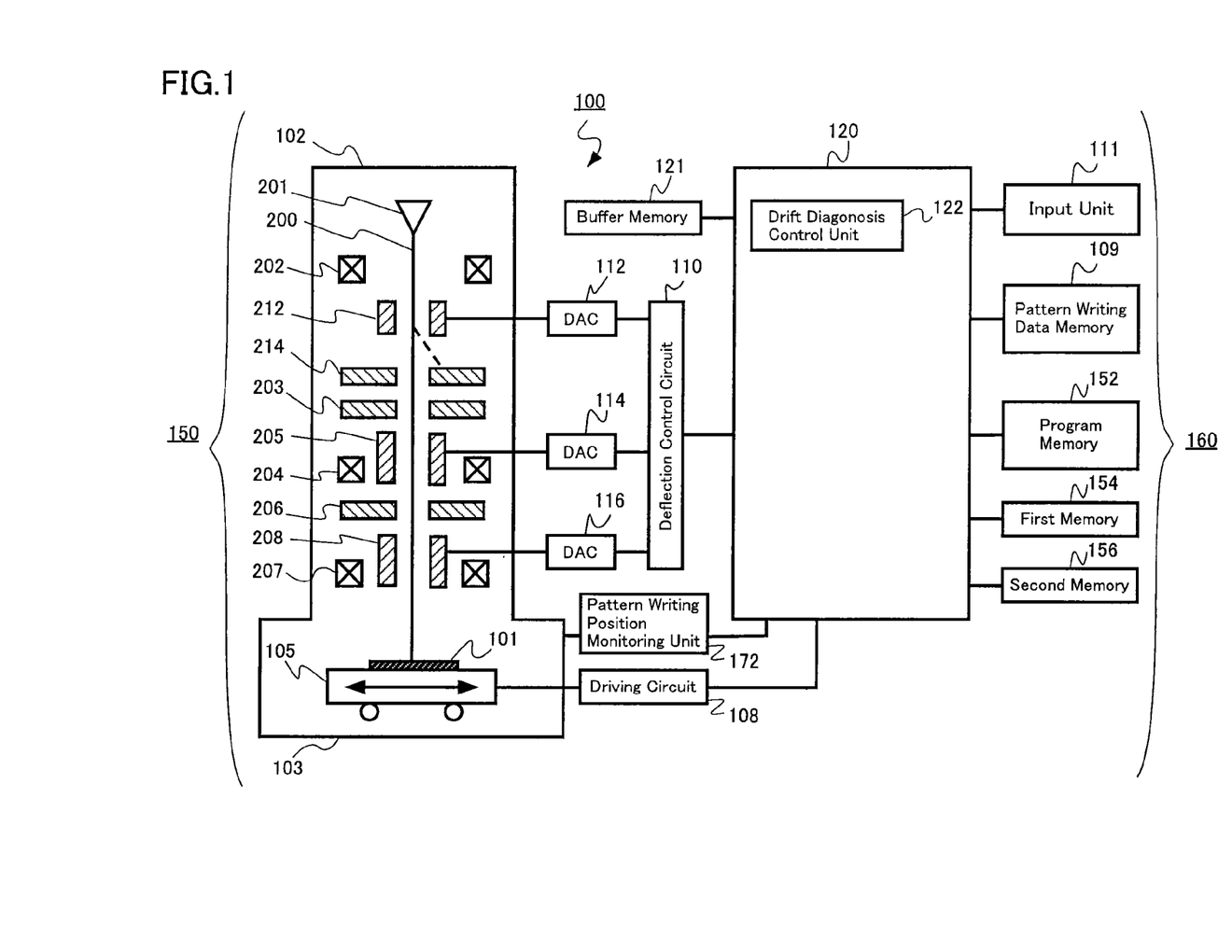
FIG. 1 is a conceptual diagram illustrating a configuration of a writing apparatus according to a first embodiment.

FIG. 1 is a conceptual diagram illustrating a configuration of a writing apparatus according to the present embodiment.

In FIG. 1, a writing apparatus 100 includes a writing unit 150 and a control unit 160. The writing apparatus 100 is an example of a charged particle beam writing apparatus. Further, the writing apparatus 100 writes a desired pattern on a target object 101.

The writing unit 150 includes an electron lens barrel 102 and a pattern writing chamber 103. In the electron lens barrel 102, an electron gun assembly 201, an illumination lens 202, a blanking (BLK) deflector 212, a blanking (BLK) aperture plate 214, a first aperture plate 203, a projection lens 204, a deflector 205, a second aperture plate 206, an objective lens 207 and a deflector 208 are arranged.

Further, in the pattern writing chamber 103, an XY stage 105 which is movably arranged is arranged. Furthermore, the target object 101 is arranged on the XY stage 105. The target object 101 includes, for example, an exposure mask substrate for transferring a pattern on a wafer. A mask substrate includes mask blanks on which no pattern is written.

The control unit 160 has an input unit 111, a pattern writing data memory 109, a program memory 152, a first memory 154, a second memory 156, a pattern writing position monitoring unit 172, a driving circuit 108, a deflection control circuit 110, digital/analog converters (DAC) 112, 114 and 116, a control calculator 120 and a buffer memory 121. The control calculator 120 has a function of, for example, a drift diagnosis control unit 122.

The pattern writing data memory 109 stores pattern writing data of a pattern to be written on the mask 101. The program memory 152 stores a control program which causes the control calculator 120 to execute each processing. The first memory 154 stores a position coordinate which is a position at which drift diagnosis is executed and which triggers a change from a first time interval pattern to a second time interval pattern. The second memory 156 stores the first and second time interval patterns which define time intervals to diagnose a drift amount of an electron beam.

The control calculator 120 is connected with, for example, the input unit 111, the pattern writing data memory 109, the program memory 152, the first memory 154, the second memory 156, the pattern writing position monitoring unit 172, the driving circuit 108, the deflection control circuit 110, and the buffer memory 121 through a bus. The deflection control circuit 110 is connected to the DACs 112, 114 and 116. The DAC 112 is connected to the BLK deflector 212. The DAC 114 is connected to the deflector 205. The DAC 116 is connected to the deflector 208.

The control calculator 120 receives an input of pattern writing data stored in the pattern writing data memory 109. Further, the control calculator 120 executes, for example, each processing according to a control program stored in the program memory 152. Information to be inputted to the control calculator 120 or each information obtained during and after computation processing is stored in the buffer memory 121 every time.

The drift diagnosis control unit 122 has a function of changing diagnosis of the drift amount based on the first time interval pattern to diagnosis of the drift amount based on the second time interval pattern, based on information of a pattern writing position obtained by the pattern writing position monitoring unit 172.

The electron gun assembly 201 which is an example of an irradiating unit performs irradiation of an electron beam 200. The electron beam 200 emitted from the electron gun assembly 201 illuminates the whole first aperture plate 203 having a rectangular hole through the illumination lens 202.

The electron beam 200 is first shaped into a rectangular shape by the first aperture plate 203. Then, the electron beam 200 of a first aperture image having passed through the first aperture plate 203 is projected on the second aperture plate 206 by the projection lens 204. The position of the first aperture image on the second aperture plate 206 is controlled to be deflected by the deflector 205, so that the beam shape and dimensions can be changed. As a result, the electron beam 200 is shaped.

Further, a focus of the electron beam 200 of the second aperture image which passes through the second aperture plate 206 is adjusted by the objective lens 207, and the electron beam is deflected by the deflector 208. As a result, a desired position of the target object 101 on the XY stage 105 which continuously moves is irradiated by the electron beam. Movement of the XY stage 105 is driven by the driving circuit 108. A deflecting voltage of the deflector 205 is controlled by the deflection control circuit 110 and the DAC 114. The deflecting voltage of the deflector 208 is controlled by the deflection control circuit 110 and the DAC 116.

The pattern writing position monitoring unit 172 monitors which position of the mask 101 is written by the electron beam. For example, a position of the XY stage 105 is learned using a laser interferometer to specify a pattern writing position.

Meanwhile, when an irradiation time t which allows a desired dose of the electron beam 200 on the target object 101 to be incident on the target object 101 is reached, blanking occurs as described below. That is, to prevent the target object 101 from being irradiated by the electron beam 200 more than necessary, the electron beam 200 is deflected by the BLK deflector 212 of the electrostatic type and the electron beam 200 is cut by the BLK aperture plate 214. By this means, the electron beam 200 is prevented from reaching the surface of the target object 101. A deflecting voltage of the BLK deflector 212 is controlled by the deflection control circuit 110 and the DAC 112.

Upon beam on (blanking off), the electron beam 200 emitted from the electron gun assembly 201 moves on a trajectory indicated by a solid line in FIG. 1. Meanwhile, upon beam off (blanking on), the electron beam 200 emitted from the electron gun assembly 201 moves on a trajectory indicated by a dotted line in FIG. 1. Further, the pattern writing chamber 103 in the electron lens barrel 102 is vacuumed by a vacuum pump which is not illustrated, and contains a vacuum atmosphere whose pressure is lower than an atmospheric pressure.

A writing pattern is written on the mask 101 using the writing apparatus 100 employing the above configuration.

FIG. 1 illustrates components which are necessary to describe the present embodiment. It goes without saying that another configuration normally needed for the writing apparatus 100 is included.

Further, although FIG. 1 illustrates that the control calculator 120 which is an example of the computer executes processing of each function such as the drift diagnosis control unit 122, the present disclosure is not limited thereto. For example, the processing of each function may be executed by hardware such as an electric circuit. Alternatively, the processing of each function may be executed by a combination of hardware such as an electric circuit and software. Alternatively, a combination of such hardware and firmware may be used.

Figure 2:
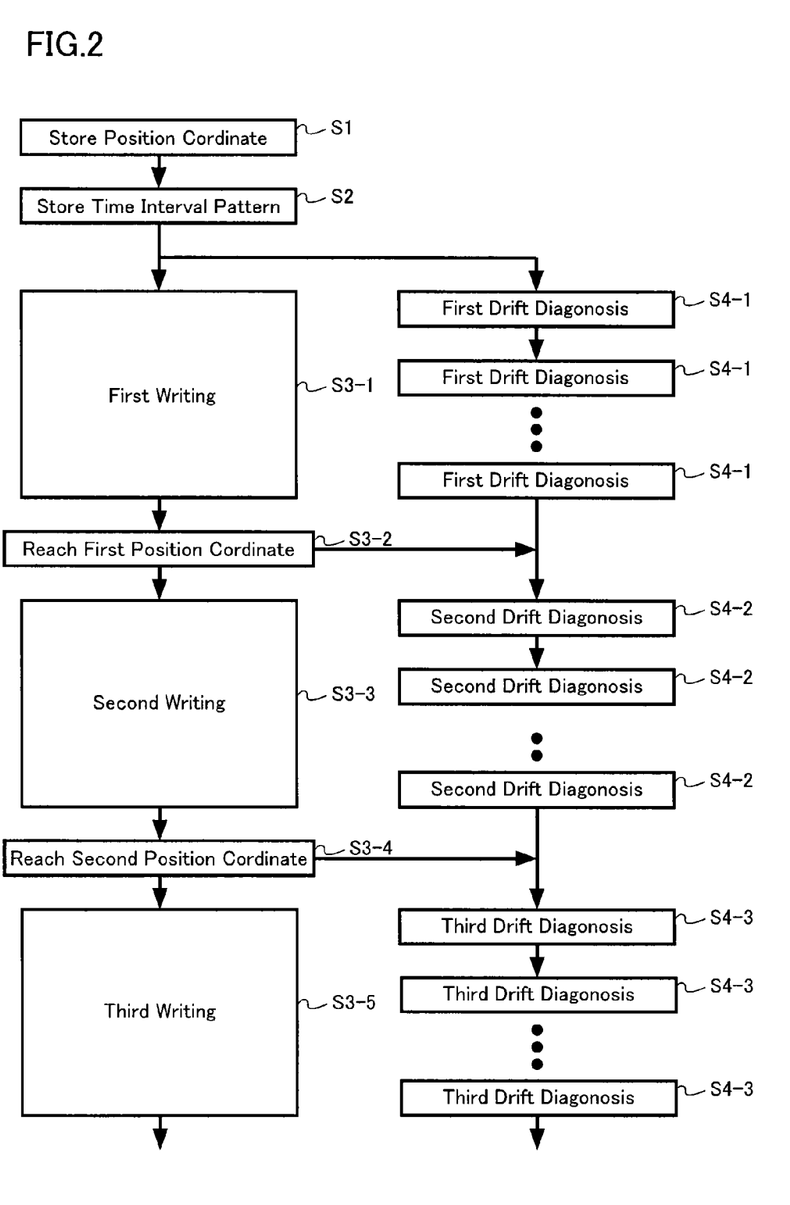
FIG. 2 is a view illustrating a flowchart of a pattern writing method according to the first embodiment.

FIG. 2 is a view illustrating a flowchart of a pattern writing method according to the present embodiment. An electron beam pattern writing method using the writing apparatus 100 will be described below with reference to the flowchart of the pattern writing method illustrated in FIG. 2.

An electron beam pattern writing method according to the present embodiment includes: storing in an electron beam writing apparatus a position coordinate at which a drift amount is diagnosed; storing in the electron beam writing apparatus a first time interval pattern which defines a time interval to diagnose a drift amount of an electron beam and a second time interval pattern which is associated with the position coordinate and defines the time interval to diagnose the drift amount of the electron beam; performing first writing of irradiating a target object with the electron beam using the writing apparatus, and writing a predetermined writing pattern on the target object while diagnosing the drift amount of the electron beam based on the first time interval pattern during the writing; diagnosing the drift amount of the electron beam when the writing reaches the position coordinate; and performing second writing of irradiating the target object with the electron beam after the writing reaches the position coordinate, and writing the predetermined writing pattern on the target object while diagnosing the drift amount of the electron beam based on the second time interval pattern during the writing.

First, the writing apparatus 100 is caused to store a position coordinate at which the drift amount is diagnosed prior to writing (S1). A position coordinate of an input is read as electronic data from, for example, the input unit 111 which has a function of reading an electronic recording medium. Further, it is also possible to directly input the position coordinate from the input unit 111 which has a keyboard. A read time interval pattern is stored in the first memory 154.

The position coordinate is a position coordinate of a position at which the drift amount is predicted to significantly change at a specific position as a boundary. For example, the position is, for example, a position at which a parameter related to writing changes such as a position at which a figure shape of a writing pattern changes or a position at which a writing condition changes.

The position coordinate is, for example, a XY coordinate on the mask 101. The position coordinate may be one of an X coordinate and a Y coordinate.

According to the present embodiment, for example, two position coordinates, that is, a first position coordinate and a second position coordinate are stored (S1).

Next, first, second and third time interval patterns which define time intervals to diagnose the drift amount of an electron beam are stored in the electron beam writing apparatus 100 (S2). The time interval pattern defines a time interval of drift diagnosis performed by stopping writing during writing. The second time interval pattern is associated with the first position coordinate. That is, the second time interval pattern is associated with a first position coordinate reach event which occurs when a pattern writing position reaches the first position coordinate. Further, a third time interval pattern is associated with the second position coordinate. That is, the third time interval pattern is associated with a second position coordinate reach event which occurs when a pattern writing position reaches the second position coordinate.

The first time interval pattern and the second time interval pattern may define different time intervals. For example, the second time interval pattern defines a time interval narrower than that of the first time interval pattern. That is, according to the second time interval pattern, while a writing pattern is written, the drift amount is diagnosed more frequently than the first time interval pattern.

Further, for example, the first time interval pattern may define a time interval pattern of an equal interval, and the second time interval pattern may define a time interval pattern of an equal pattern which is narrower than that of the first time interval pattern.

The first and second time interval patterns of an input are read as electronic data from, for example, the input unit 111 which has a function of reading an electronic recording medium. A read time interval pattern is stored in the second memory 156.

When a writing pattern is written, the control calculator 120 first reads pattern writing data from the pattern writing data memory 109. The pattern writing data is, for example, taken in the writing apparatus 100 from the input unit 111. The input unit 111 is an example of an input means, and is, for example, a reading apparatus which reads information from an external memory.

Next, the electron gun assembly 201 which is an example of an irradiating unit irradiates the mask 101 with the electron beam 200 to write a writing pattern based on predetermined pattern writing data on the mask 101 (S3-1: first writing).

During first writing, the drift amount of an electron beam is diagnosed based on the first time interval pattern during writing (S4-1: first drift diagnosis). Further, a predetermined pattern is written on the mask 101 while performing drift correction based on a diagnosis result of the drift amount (first writing). That is, a cycle of writing-first drift diagnosis-writing is repeated. A time interval of this drift diagnosis is controlled by the drift diagnosis control unit 122. Drift diagnosis is performed every time in a state where writing a pattern is stopped during writing.

During first writing, the pattern writing position monitoring unit 172 monitors a pattern writing position. Further, writing reaches the first position coordinate (S3-2). When the writing reaches the first position coordinate, the first position coordinate reach event occurs.

When the writing reaches the first position coordinate, the drift amount is diagnosed. Further, after the writing reaches the first position coordinate, the drift amount of an electron beam is diagnosed based on the second time interval pattern instead of the first time interval pattern during second writing (S4-2). Further, a predetermined pattern is written on the mask 101 while performing drift correction based on a diagnosis result of the drift amount (S3-3: second writing). That is, a cycle of writing-second drift diagnosis-writing is repeated.

Meanwhile, the drift diagnosis control unit 122 has a function of changing diagnosis of the drift amount based on the first time interval pattern to diagnosis of the drift amount based on the second time interval pattern, based on information of a pattern writing position obtained by the pattern writing position monitoring unit 172.

During second writing, the pattern writing position monitoring unit 172 monitors a pattern writing position. Further, writing reaches the second position coordinate (S3-4). When the writing reaches the second position coordinate, the second position coordinate reach event occurs.

When the writing reaches the second position coordinate, the drift amount is diagnosed. After the writing reaches the second position coordinate, the drift amount of an electron beam is diagnosed based on the third time interval pattern during third writing (S4-3: third drift diagnosis). Further, a predetermined pattern is written on the mask 101 while performing drift correction based on a diagnosis result of the drift amount (S3-5: third writing). That is, a cycle of writing-third drift diagnosis-writing is repeated.

Meanwhile, the drift diagnosis control unit 122 changes diagnosis of the drift amount based on the second time interval pattern to diagnosis of the drift amount based on the third time interval pattern, based on information of a pattern writing position obtained by the pattern writing position monitoring unit 172.

Figure 3:
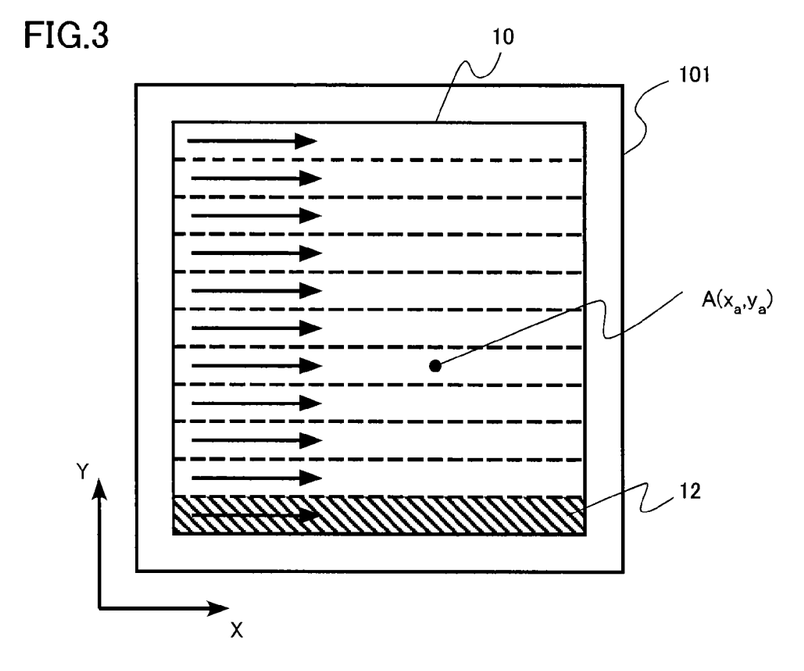
FIG. 3 is an explanatory view of the pattern writing method according to the first embodiment.

FIG. 3 is an explanatory view of the pattern writing method according to the present embodiment.

As illustrated in FIG. 3, on the mask 101, there is a pattern area 10 on which a pattern is written. Further, this pattern area 10 is divided into, for example, a plurality of stripe areas 12 of strip shapes.

The width of the stripe area 12 is defined by, for example, a width at which an electron beam can be deflected. The stripe area 12 is a unit area corresponding to one time of scan of an electron beam. When a pattern is written, an electron beam scans the stripe area 12 of the lowermost portion in an arrow direction in FIG. 3 by moving the XY stage 105 in the X direction. When writing the pattern is finished in the stripe area 12 of the lowermost portion, the XY stage 105 is moved in the Y direction, and the pattern is sequentially written in the upper stripe areas 12.

A position which triggers a change from the first time interval pattern to the second time interval pattern is a position A in FIG. 3, and a position coordinate of this position is $(x_a, y_a)$. When scanning is performed using an electron beam and writing reaches the position coordinate $(x_a, y_a)$, drift diagnosis is executed, and a time interval pattern to diagnose the drift amount is changed from the first time interval pattern to the second time interval pattern.

In addition, a timing to execute drift diagnosis and switch to the second time interval pattern is not limited in particular as long as the timing is triggered at the position A. For example, the timing may come at a point of time when writing a pattern in the stripe area including the position A is finished or may come a predetermined time after the writing reaches the position A.

It is also possible to change the second time interval pattern to the third time interval pattern in the same way.

Figure 4:
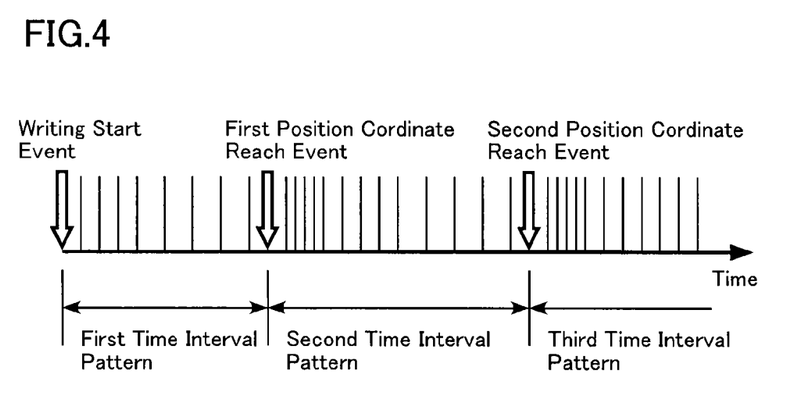
FIG. 4 is an explanatory view of a time interval pattern change according to the first embodiment.

FIG. 4 is an explanatory view of a time interval pattern change according to the present embodiment. When, for example, writing is started (writing start event), the drift amount is diagnosed based on the first time interval pattern.

In addition, each one of vertical bars on the time axis indicates onetime of drift diagnosis. Further, as illustrated in FIG. 4, as the time passes since occurrence of the event, a time interval pattern whose time interval is longer is preferably adopted. This is because there is a concern that the drift amount is greatest immediately after the event.

When writing reaches the position coordinate ($x_a$, $y_a$) (first position coordinate reach event), a change is made such that the drift amount is diagnosed based on the second time interval pattern. Meanwhile, the second time interval pattern defines a time interval narrower than that of the first time interval pattern. That is, according to the second time interval pattern, the drift amount is diagnosed more frequently.

Further, the second time interval pattern preferably defines a time interval narrower than that of the first time interval pattern. When the drift amount significantly changes, it is possible to adequately diagnose and correct the drift amount.

Drift diagnosis which is triggered by the second position coordinate reach event and change from the second time interval pattern to the third time interval pattern are also performed in the same way.

Although a method of drift diagnosis is not limited in particular, drift diagnosis is performed by, for example, interrupting writing, then irradiating with an electron beam a drift diagnosis reference mark fixed on the XY stage 105 and measuring a shift from a desired beam position. Further, as a result of drift diagnosis, correction of a beam irradiation position, that is, so-called drift correction is performed according to the obtained drift amount. Drift correction is performed by correcting, for example, deflection sensitivity coefficients of the DACs 112, 114 and 116. Writing of a pattern after drift diagnosis is thus executed while performing drift correction based on a result of drift diagnosis.

In addition, drift correction is performed stepwise or continuously during writing instead of correcting the drift amount obtained by drift diagnosis once from the view point of preventing a pattern to be written from being discontinuous.

An electron beam pattern writing program according to the embodiment is a program which causes a computer mounted on the writing apparatus 100 to execute the electron beam pattern writing method. The control calculator 120 is an example of the computer.

More specifically, the electron beam pattern writing program is a program which causes the computer mounted on the writing apparatus 100 to execute: processing of storing in an electron beam writing apparatus a position coordinate at which a drift amount is diagnosed; processing of storing in the electron beam writing apparatus a first time interval pattern which defines a time interval to diagnose a drift amount of an electron beam and a second time interval pattern which is associated with the position coordinate and defines the time interval to diagnose the drift amount of the electron beam; processing of performing first writing of irradiating a target object with the electron beam using the writing apparatus, and writing a predetermined writing pattern on the target object while diagnosing the drift amount of the electron beam based on the first time interval pattern during the writing; processing of diagnosing the drift amount of the electron beam when the writing reaches the position coordinate; and processing of performing second writing of irradiating the target object with the electron beam after the writing reaches the position coordinate, and writing the predetermined writing pattern on the target object while diagnosing the drift amount of the electron beam based on the second time interval pattern during the writing.

This program is stored in a computer-readable recording medium such as a magnetic disk apparatus, a magnetic tape apparatus, a FD or a ROM (Read Only Memory). More specifically, for example, this program is stored in the program memory 152 of the writing apparatus 100.

As described above, according to the present embodiment, drift diagnosis is adequately executed, so that it is possible to make high writing precision and high throughput compatible.

Second Embodiment

An electron beam writing apparatus according to the present embodiment specifies a position of a position coordinate stored in the electron beam writing apparatus at which a change rate of a shot density upon writing of a writing pattern exceeds a predetermined change rate (threshold). The shot density may be the number of shots per area or may be the number of shots per time. Contents other than the position coordinate are the same as those in the first embodiment. Consequently, the contents which overlap those in the first embodiment will not be described.

For example, a change amount of the shot density can be calculated based on an estimation result of the number of shots to estimate, for example, a pattern writing time before a writing apparatus 100 performs writing. Referring to this calculation result, it is possible to specify a position coordinate of a position at which the change rate of the shot density exceeds a predetermined change rate.

At the position at which the change rate of the shot density exceeds the predetermined change rate, for example, the drift amount is predicted to rapidly change.

According to the present embodiment, drift diagnosis is performed when writing reaches the position at which the drift amount is predicted to rapidly change. Further, by changing a time interval of subsequent drift diagnosis to a time interval suitable to the predicted change, precision of writing is guaranteed. By this means, drift diagnosis is adequately executed, so that it is possible to make high writing precision and high throughput compatible.

Third Embodiment

An electron beam writing apparatus according to the present embodiment is the same as that in the first embodiment except that a position coordinate calculating unit which automatically calculates in the writing apparatus a position coordinate which triggers a change from a first time interval pattern to a second time interval pattern is provided. Consequently, the contents which overlap those in the first embodiment will not be described.

Figure 5:
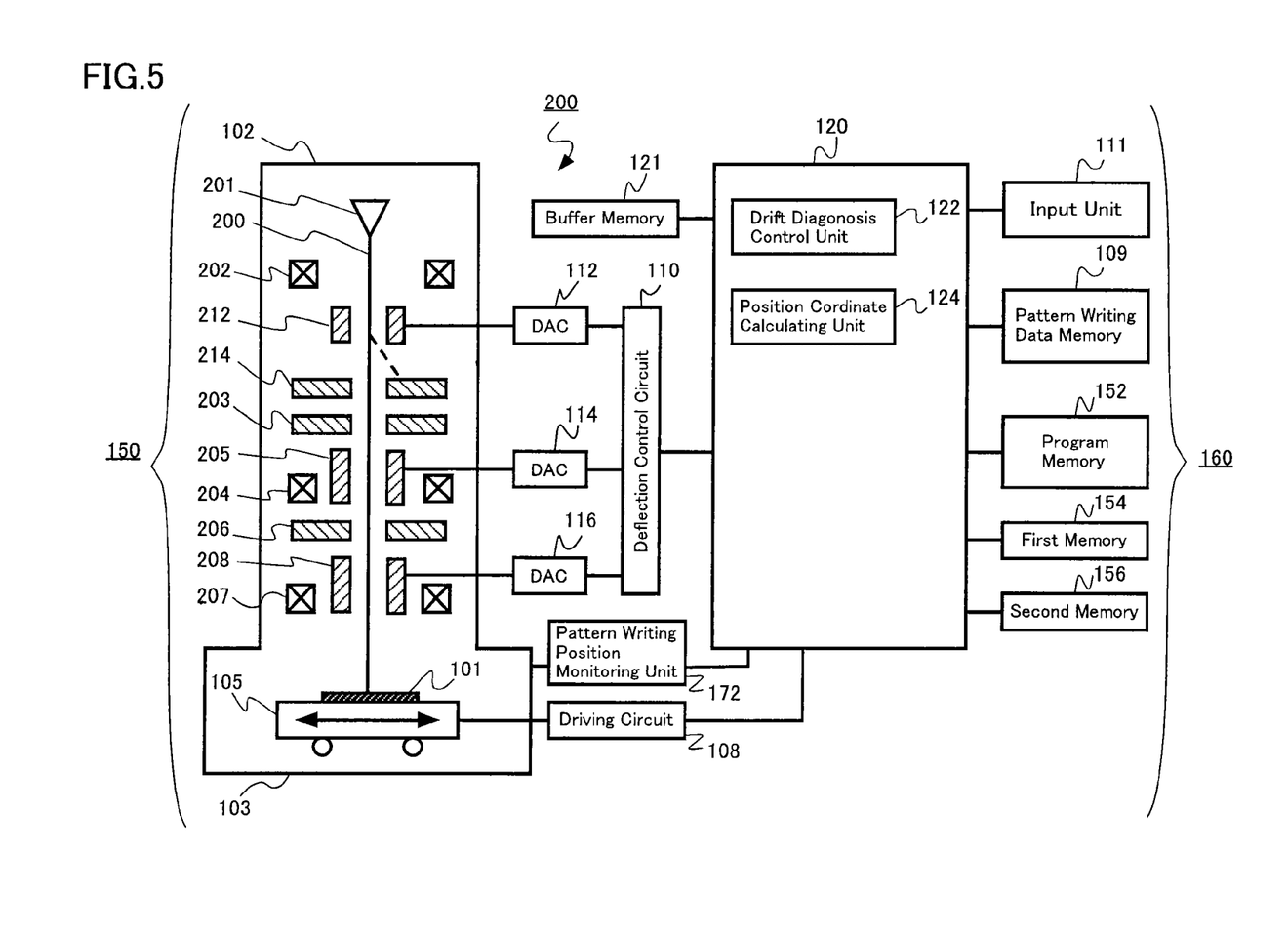
FIG. 5 is a conceptual diagram illustrating a configuration of a writing apparatus according to a third embodiment.

FIG. 5 is a conceptual diagram illustrating a configuration of the writing apparatus according to the present embodiment.

As illustrated in FIG. 5, a control calculator 120 of a control unit 160 of a writing apparatus 200 has a position coordinate calculating unit 124. The position coordinate calculating unit 124 has function of automatically calculating in the writing apparatus a position coordinate which triggers a change from a first time interval pattern to a second time interval pattern.

An electron beam pattern writing method according to the present embodiment is the same as that in the first embodiment except calculation, in the writing apparatus 200, of a position coordinate which triggers a change from a first time interval pattern to a second time interval pattern.

Figure 6:
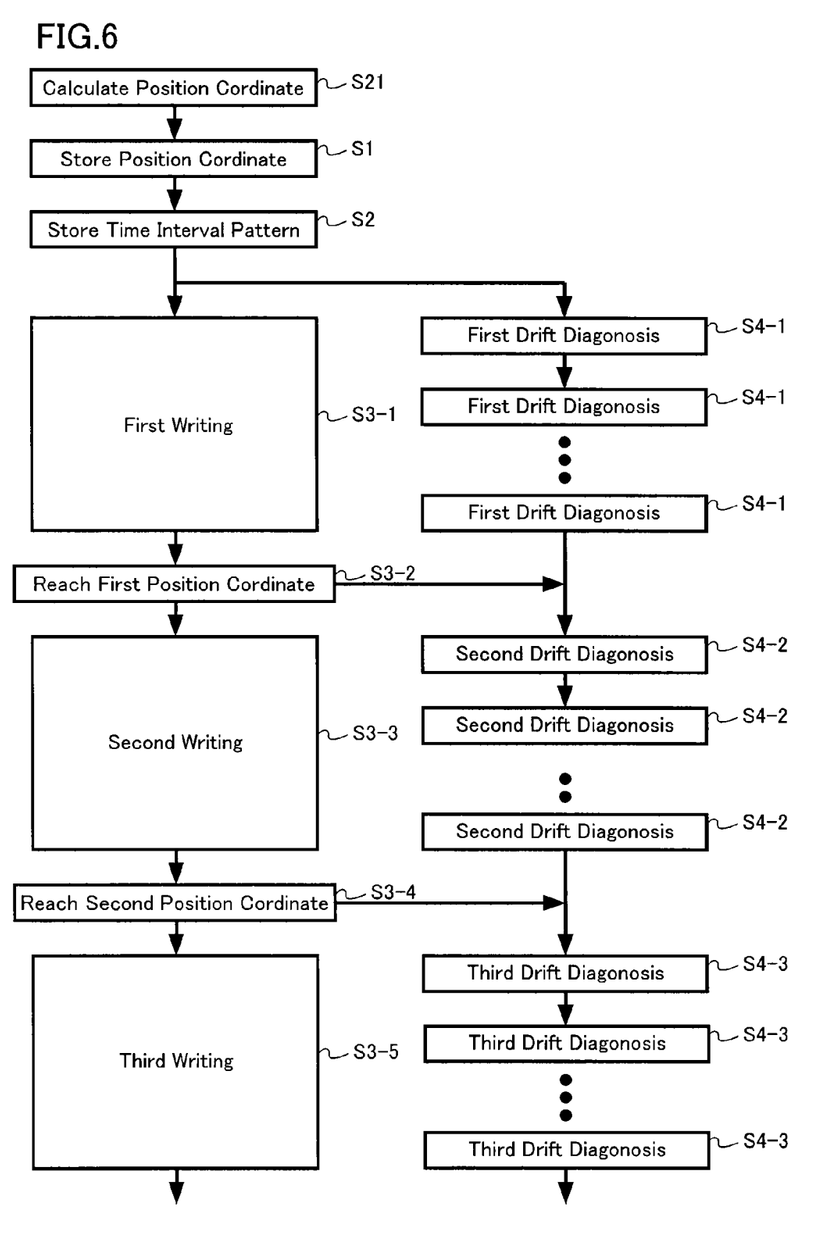
FIG. 6 is a view illustrating a flowchart of a pattern writing method according to the third embodiment.

FIG. 6 is a view illustrating a flowchart of a pattern writing method according to the present embodiment. Calculation of a position coordinate (S21) is performed as processing in the writing apparatus 200.

More specifically, based on, for example, pattern writing data stored in a pattern writing data memory 109, a shot density per unit area upon writing or a shot density per unit time is calculated. Further, a change rate of this shot density is calculated. Furthermore, a position coordinate of a position at which the change rate of the shot density exceeds a predetermined threshold is calculated. The calculated position coordinate is stored in, for example, the second memory unit 156.

According to the present embodiment, the position coordinate can be automatically calculated in the writing apparatus 200. Consequently, it is possible to achieve a higher writing efficiency compared to the first embodiment.

Fourth Embodiment

An electron beam writing apparatus according to the present embodiment is the same as that in the first embodiment except that a determining unit which determines whether or not to change to diagnosis of a drift amount based on a second time interval pattern is provided. Consequently, the contents which overlap those in the first embodiment will not be described.

Figure 7:
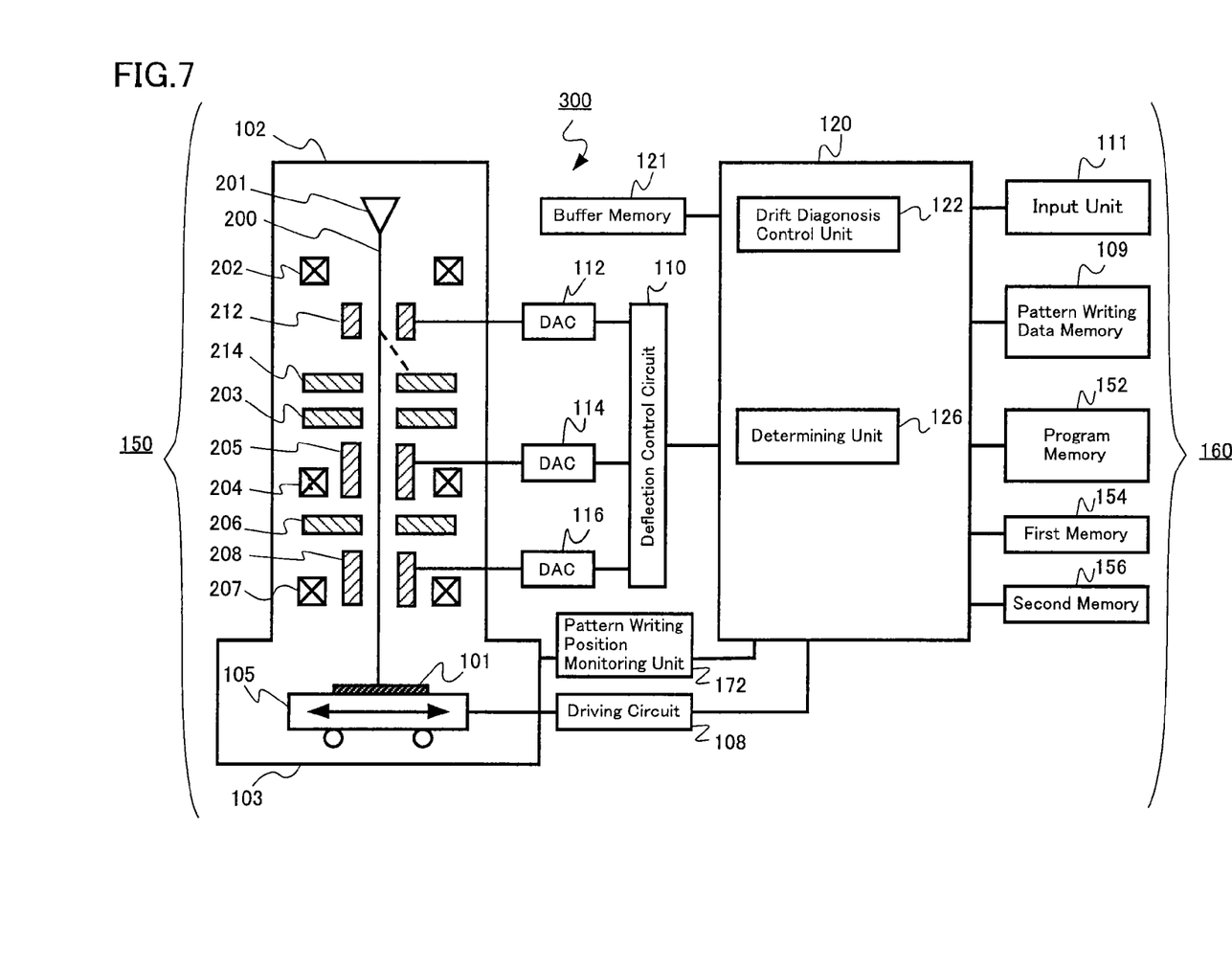
FIG. 7 is a conceptual diagram illustrating a configuration of a writing apparatus according to a fourth embodiment.

FIG. 7 is a conceptual diagram illustrating a configuration of a writing apparatus according to the present embodiment.

As illustrated in FIG. 7, a control calculator 120 of a control unit 160 of a writing apparatus 300 has a determining unit 126. The determining unit 126 has a function of, when writing reaches a predetermined position coordinate, determining whether or not to change a first time interval pattern to a second time interval pattern.

Figure 8:
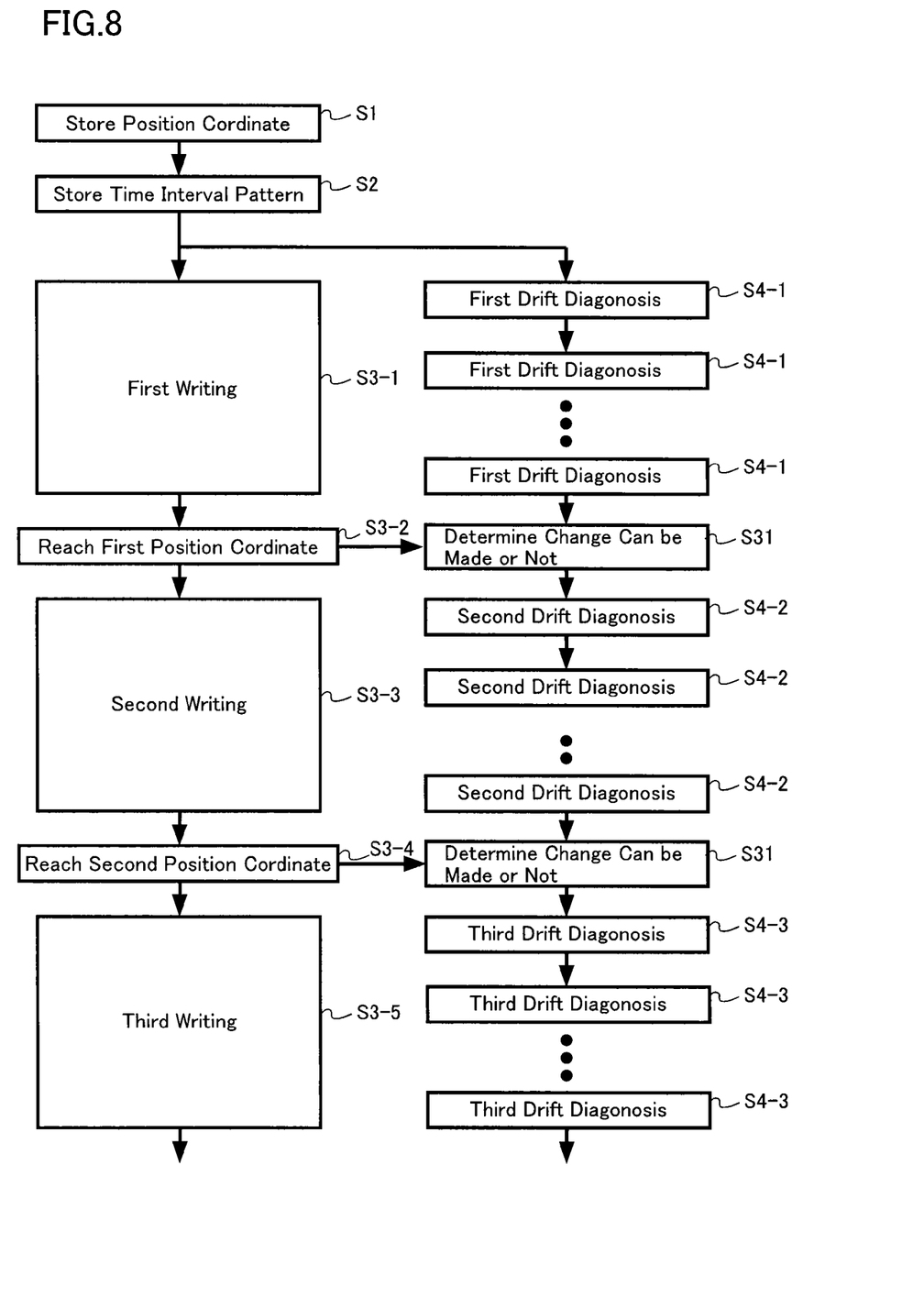
FIG. 8 is a view illustrating a flowchart of a pattern writing method according to the fourth embodiment.

FIG. 8 is a view illustrating a flowchart of a pattern writing method according to the present embodiment. After writing reaches a first position coordinate (S3-2), the determining unit 126 determines whether or not it is possible to change the first time interval pattern to the second time interval pattern (S31).

When the determining unit 126 determines that a change can be made, the first time interval pattern is switched to the second time interval pattern to diagnose a second drift amount of an electron beam (S4-2). Meanwhile, when the determining unit 126 determines that a change cannot be made, the second drift amount of an electron beam is diagnosed based on the first time interval pattern.

Similarly, after writing reaches a second position coordinate (S3-2), the determining unit 126 determines whether or not it is possible to change the second time interval pattern to a third time interval pattern (S31).

When the determining unit 126 determines that a change can be made, the second time interval pattern is switched to the third time interval pattern to diagnose a third drift amount of an electron beam (S4-3). Meanwhile, when the determining unit 126 determines that a change cannot be made, the third drift amount of an electron beam is diagnosed based on the first or second time interval pattern used upon previous writing.

Figure 9:
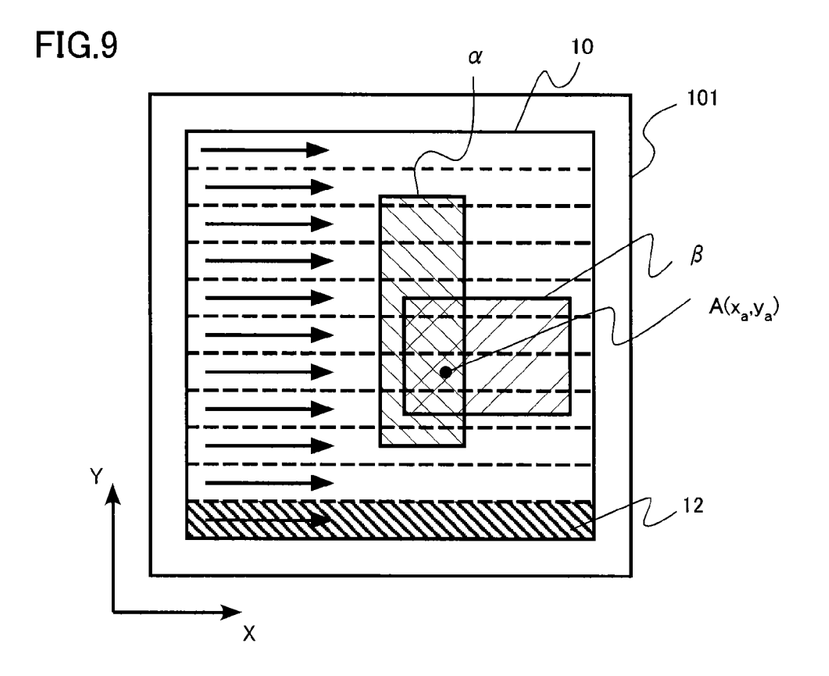
FIG. 9 is an explanatory view of the pattern writing method according to the fourth embodiment.

A determination criterion as to whether or not a change can be made is, for example, a type of a pattern writing area which is being written. FIG. 9 is an explanatory view of the pattern writing method according to the present embodiment.

For example, a pattern of a pattern area 10 of a mask 101 adopts a hierarchical structure, and there are a pattern writing area α and a pattern writing area β. Meanwhile, a pattern writing area is an area to which an identical pattern writing condition is applied upon writing. Even though positions of different pattern writing areas overlap as illustrated in FIG. 9, patterns are not simultaneously written while scan is performed once using an electron beam.

Meanwhile, a case will be described where, for example, a position A is fixed based on a shot density of the pattern of the pattern writing area β instead of the pattern writing area α. In this case, even when writing reaches the position A while a pattern is written in the pattern writing area α, it is not necessary to change a time interval pattern. Consequently, for example, the determining unit 126 acquires information of a pattern writing area in which a pattern is currently written, and determines whether or not a time interval pattern can be changed.

Further, as another example, a determination criterion as to whether or not a change can be made is whether or not there is competition with a third time interval pattern other than the second time interval pattern which is triggered by another event. For example, there are a writing temporary stop event that writing is temporarily stopped because of, for example, user's circumstances, and a corresponding third time interval pattern.

For example, a case will be described where the position coordinate reach event and the writing temporary stop event simultaneously occur during scan of a single stripe. In this case, the writing apparatus 300 needs to determine which one of the second time interval pattern and the third time interval pattern to select. This determination can be made by, for example, the determining unit 126.

According to the present embodiment, the determining unit 126 determines whether or not change to the second time interval pattern can be made, so that it is possible to optimize a setting of a time interval of drift diagnosis during writing and make high writing precision and high throughput compatible.

In the foregoing, the embodiments have been described with reference to concrete examples. However, the present disclosure is not limited to such concrete examples.

Further, although cases have been described with the embodiments where there are two pattern writing areas in the pattern area 10, the number of pattern writing areas is not limited to two.

Furthermore, although parts of the apparatus configuration, the control method, and the like which are not needed to be explained directly for the explanation of the present disclosure are not described, a necessary apparatus configuration and a necessary control method can be appropriately selected and used. Although, for example, a control unit configuration which controls the charged particle beam writing apparatus has not been described in detail, a necessary control unit configuration is appropriately selected and used, as a matter of course.

In addition, all charged particle beam writing methods, charged particle beam writing programs and charged particle beam writing apparatuses which include the elements of the present disclosure and can be attained by appropriately changing in design by a person skilled in the art are included in the spirit and scope of the disclosure.

What is claimed is:

1. A charged particle beam writing method comprising:
storing in a charged particle beam writing apparatus a specific position coordinate;
storing in the charged particle beam writing apparatus a first time interval pattern defining first time intervals to diagnose a drift amount of a charged particle beam and a second time interval pattern associated with the specific position coordinate and defining second time intervals to diagnose a drift amount of the charged particle beam;
performing a first writing by irradiating a target object with the charged particle beam using the charged particle beam writing apparatus, and writing a first predetermined writing pattern on the target object diagnosing a drift amount of the charged particle beam repeatedly with the first time intervals defined in the first time interval pattern during the first writing;
diagnosing a drift amount of the charged particle beam when the first writing reaches the specific position coordinate; and
performing a second writing by irradiating the target object with the charged particle beam after the first writing reaches the specific position coordinate, and writing a second predetermined writing pattern on the target object diagnosing a drift amount of the charged particle beam repeatedly with the second time intervals defined in the second time interval pattern during the second writing,
wherein the first time intervals increase as time passes since start of application of the first interval pattern, and the second time intervals increase as time passes since start of application of the second interval pattern.

2. The method according to claim 1, wherein the specific position coordinate specifies a position at which a change rate of a shot density exceeds a predetermined change rate.

3. The method according to claim 1, wherein each of the second time intervals is narrower than each of the first time intervals.

4. The method according to claim 1, further comprising calculating the specific position coordinate automatically based on a pattern writing data before the storing.

5. The method according to claim 4, wherein the specific position coordinate is calculated by calculating a shot density per unit area or a shot density per unit time based on the pattern writing data, calculating a change rate of the shot density, and obtaining a position coordinate of a position at which the change rate of the shot density exceeds a predetermined change rate.

6. A non-transitory computer-readable recording medium having a charged particle beam writing program causing a computer mounted on a writing apparatus to execute:
processing of storing in a charged particle beam writing apparatus a specific position coordinate;
processing of storing in the charged particle beam writing apparatus a first time interval pattern defining first time intervals to diagnose a drift amount of a charged particle beam and a second time interval pattern associated with the specific position coordinate and defining second time intervals to diagnose a drift amount of the charged particle beam;
processing of performing a first writing by irradiating a target object with the charged particle beam using the charged particle beam writing apparatus, and writing a first predetermined writing pattern on the target object diagnosing a drift amount of the charged particle beam repeatedly with the first time intervals defined in the first time interval pattern during the first writing;
processing of diagnosing a drift amount of the charged particle beam when the first writing reaches the specific position coordinate; and
processing of performing a second writing by irradiating the target object with the charged particle beam after the first writing reaches the specific position coordinate, and writing a second predetermined writing pattern on the target object diagnosing a drift amount of the charged particle beam repeatedly with the second time intervals defined in the second time interval pattern during the second writing,
wherein the first time intervals increase as time passes since start of application of the first interval pattern, and the second time intervals increase as time passes since start of application of the second interval pattern.

7. The recording medium according to claim 6, wherein the specific position coordinate specifies a position at which a change rate of a shot density exceeds a predetermined change rate.

8. The recording medium according to claim 6, wherein each of the second time intervals is narrower than each of the first time intervals.

9. The recording medium according to claim 6, further comprising calculating the specific position coordinate automatically based on a pattern writing data before the storing.

10. The recording medium according to claim 9, wherein the specific position coordinate is calculated by calculating a shot density per unit area or a shot density per unit time based on the pattern writing data, calculating a change rate of the shot density, and obtaining a position coordinate of a position at which the change rate of the shot density exceeds a predetermined change rate.

11. A charged particle beam writing apparatus comprising:
a first memory configured to store a specific position coordinate at which a drift amount is diagnosed;
a second memory configured to store a first time interval pattern defining first time intervals to diagnose a drift amount of a charged particle beam and a second time interval pattern associated with the specific position coordinate and defining second time intervals to diagnose a drift amount of the charged particle beam;
a writing unit configured to irradiate a target object with the charged particle beam and write a predetermined writing pattern on the target object;
a pattern writing position monitoring unit configured to monitor a pattern writing position; and
a drift diagnosis control unit configured to comprise a function of diagnosing a drift amount of the charged particle beam repeatedly with the first time intervals defined in the first or repeatedly with the second time intervals defined in second time interval pattern, and changing diagnosis of a drift amount based on the first time interval pattern to diagnosis of a drift amount based on the second time interval pattern after reaching of the pattern writing position to the specific position coordinate, based on information of the pattern writing position obtained by the pattern writing position monitoring unit,
wherein the first time intervals increase as time passes since start of application of the first interval pattern, and the second time intervals increase as time passes since start of application of the second interval pattern.

12. The apparatus according to claim 11, wherein the specific position coordinate specifies a position at which a change rate of a shot density exceeds a predetermined change rate.

13. The apparatus according to claim 11, wherein each of the second time intervals is narrower than each of the first time intervals.

14. The apparatus according to claim 11, further comprising a position coordinate calculating unit configured to automatically calculate the specific position coordinate based on a pattern writing data.

15. The apparatus according to claim 11, further comprising a determining unit configured to determine whether or not to change diagnosis of the drift amount based on the first time interval pattern to diagnosis of the drift amount based on the second time interval pattern.

* * * * *